US009929293B1

(12) United States Patent
Kim et al.

(10) Patent No.: US 9,929,293 B1
(45) Date of Patent: Mar. 27, 2018

(54) SUPERLATTICE PHOTODETECTOR HAVING IMPROVED CARRIER MOBILITY

(71) Applicant: Sandia Corporation, Albuquerque, NM (US)

(72) Inventors: Jin K. Kim, Albuquerque, NM (US); John F. Klem, Albuquerque, NM (US); Eric A. Shaner, Rio Rancho, NM (US); Benjamin Varberg Olson, Albuquerque, NM (US); Emil Andrew Kadlec, Albuquerque, NM (US); Anna Tauke-Pedretti, Albuquerque, NM (US); Torben Ray Fortune, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/479,134

(22) Filed: Apr. 4, 2017

(51) Int. Cl.
| | |
|---|---|
| H01L 31/09 | (2006.01) |
| H01L 31/18 | (2006.01) |
| H01L 31/0352 | (2006.01) |
| H01L 31/0304 | (2006.01) |
| H01L 31/0224 | (2006.01) |
| H01L 31/109 | (2006.01) |

(52) U.S. Cl.
CPC ........... H01L 31/035236 (2013.01); H01L 31/022408 (2013.01); H01L 31/03046 (2013.01); H01L 31/035281 (2013.01); H01L 31/109 (2013.01)

(58) Field of Classification Search
CPC ............ H01L 31/109; H01L 31/02161; H01L 31/035236; H01L 31/03046
See application file for complete search history.

(56) References Cited

U.S. PATENT DOCUMENTS

| | | | | |
|---|---|---|---|---|
| 5,170,407 A | * | 12/1992 | Schubert ............. | H01S 5/18361 372/45.01 |
| 2015/0155420 A1 | * | 6/2015 | Webster ................ | H01L 31/109 257/13 |

OTHER PUBLICATIONS

Aytac, Y. et al., "Carrier recombination in mid-wave infrared InAs/InAsSb supertatices" Sandia National Laboratories, 2013, SAND2013-9900A.
Downs, C. et al., "Progress in Infrared Photodetectors Since 2000", Sensors, 2013, pp. 5054-5098, vol. 13.
Olson, B. V. et al., "Minority Carrier Lifetime and Dark Current Measurements in Mid-Wavelength Infrared InAs0.91Sb0.09Alloy nBn Photodetectors", Applied Physics Letters, 2015, 183504, vol. 107.

(Continued)

Primary Examiner — Jasmine Clark
(74) Attorney, Agent, or Firm — Martin I. Finston

(57) ABSTRACT

In a superlattice (SL) photodetector, each period of the SL includes first and second semiconductor layers having different compositions, at least one of which comprises indium arsenide (InAs). At least one of these two semiconductor layers has a graded composition. In embodiments, the first semiconductor layer comprises InAs and the second semiconductor layer is a graded layer comprising indium arsenide antimonide (InAsSb), wherein the antimony (Sb) concentration is varied. In examples, the Sb concentration in the second layer gradually increases from the top and bottom toward the middle of the layer.

8 Claims, 2 Drawing Sheets

(56) References Cited

OTHER PUBLICATIONS

Olson, B. V. et al., "Auger Recombination in Long-Wave Infrared InAs/InAsSb type-II Superlattices", Applied Physics Letters, 2015, 261104, vol. 107.
Olson, B. V. et al., "Intensity-and Temperature-Dependent Carrier Recombination in InAs/InAs1-xSbx", Physical Review Applied, 2015, 044010, vol. 3.
Olson, B. V. et al., "Identification of Dominant Recombination Mechanisms in Narrow-bandgap InAs/InAsSb type-II Superlattices and InAsSb Alloys", Applied Physics Letters, 2013, 052106, vol. 103.
Steenbergen, E. H. et al., "Significantly Improved Minority Carrier Lifetime Observed in a Long-Wavelength Infrared III-V type-II Superlattice comprised of InAs/InAsSb", Applied Physics Letters, 2011, 251110, vol. 99.
Steenbergen, E. H. et al., "Structural and Optical Characterization of Type-II InAs/InAs1-xSbx", Applied Physics Letters, 2011, 071111, vol. 99.

\* cited by examiner

SUPERLATTICE PHOTODETECTOR HAVING IMPROVED CARRIER MOBILITY

STATEMENT OF GOVERNMENT INTEREST

This invention was made with Government support under contract no. DE-AC04-94AL85000 awarded by the U.S. Department of Energy to Sandia Corporation. The Government has certain rights in this invention.

BACKGROUND

Photodetectors are used in various applications including communications, imaging and power generation. When a photodetector is exposed to light within an operating range of wavelengths, electron-hole pairs are generated due to light absorption by certain materials of the photodetector. These generated electron-hole pairs are transported to form a photocurrent under an applied electric bias. In some super-lattice based photodetectors for operating wavelengths in the range 3-30 μm, the hole mobility is relatively low. This can inhibit the performance of the photodetector, particularly at the long-wavelength end of its operating range.

SUMMARY

The present invention relates to a superlattice (SL) photodetector in which each period of the SL includes first and second semiconductor layers having different compositions, at least one of which comprises indium arsenide (InAs). At least one of these two semiconductor layers has a graded composition.

In embodiments, the first semiconductor layer comprises InAs and the second semiconductor layer is a graded layer comprising indium arsenide antimonide (InAsSb), wherein the antimony (Sb) concentration is varied. In examples, the Sb concentration in the second layer gradually increases from the top and bottom toward the middle of the layer.

DETAILED DESCRIPTION

The quantum efficiency of an SL-type photodetector can be improved by enhancing the electron mobility and/or the hole mobility. In accordance with the present invention, I have provided a superlattice with enhanced carrier mobility in a III-V superlattice. In an embodiment, there is provided a superlattice of InAs and InAsSb with intentional composition grading which enhances the hole mobility, thereby improving the photodetector performance.

Various embodiments relate to controlling the atomic fraction of Sb in the superlattice in order to improve vertical transport of carriers, thereby enhancing carrier mobility within the superlattice.

Figure 1:
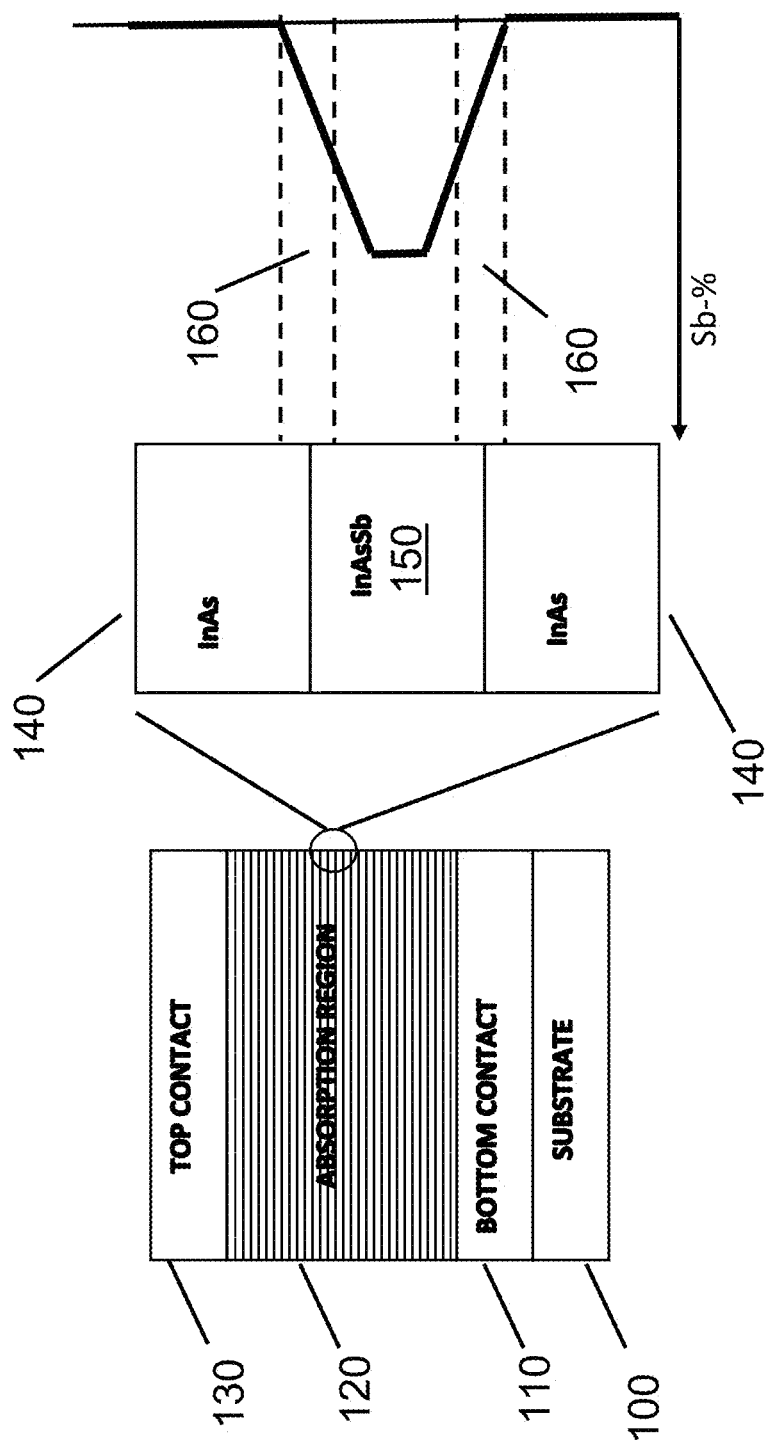
FIG. 1 is a notional cross-sectional view of an example photodetector in accordance with an embodiment of the invention.

A cross section of an example SL-type photodetector is depicted notionally in FIG. 1. The device regions represented in the figure are substrate 100, bottom contact 110, absorption region 120, and top contact 130. As those skilled in the art will understand, the detailed design of the photodetector may conform to any of various designs that are known in the art and need not be described here in detail. Such designs may, in specific cases, involve additional structures not shown here, including, for example, buffer layers, barrier layers, and semiconductor contact layers.

The absorption region 120 includes a III-V superlattice. In the example provided by the expanded detail of FIG. 1, the superlattice includes layers 140 principally composed of InAs that alternate with layers 150 composed of InAsSb. A typical layer thickness within the superlattice would lie within the range 0.1-10 nm, although thicknesses outside that range are not excluded.

Two periods, each consisting of two layers, i.e. one layer 140 and one layer 150, constitute the minimum required to form a superlattice. As a practical matter, however, we believe that at least ten periods would be required in order to realize the advantages of the present invention, and devices may advantageously have as many as 600 periods or even more. Although the example we provide below has a typical period thickness of 48 Å (i.e., 4.8 nm), the period thicknesses in particular embodiments may vary widely, for example from 10 Å to 500 Å (1-50 nm).

As seen in the figure, the concentration (or equivalently, the atomic fraction) of Sb is graded within at least InAsSb layer 150. In the specific, but non-limiting example illustrated in the figure, the Sb concentration within layer 150 has a flat-topped profile that is greatest near the center of the layer and least near the top and bottom of the layer.

In some embodiments, the Sb concentration gradient crosses the interfaces between the layers 140 and 150, so that there is a transition region 160 near each such interface. In other embodiments, the layers 140 are substantially free of Sb, i.e., any Sb that is present is insufficient to affect the bandgap enough to have a significant effect on device operation. In such embodiments, the only transition regions would be those that result from incidental diffusion of Sb across the interfaces.

Additional structure is also possible within the layers of the superlattice. For example, it might be possible to further improve hole mobility by inserting an intermediate layer of gallium arsenide (GaAs) within each of the InAs layers of the superlattice.

Fabrication of the device of FIG. 1 is by conventional methods that need not be described here in detail. Growth of the SL by molecular beam epitaxy (MBE) offers sufficient control over the layer composition to provide the desired graded profiles.

For example, relevant information about superlattice devices and techniques for fabricating them is provided in the following publications, the entirety of each of which is hereby incorporated herein by reference: B. V. Olson et al., "Identification of dominant recombination mechanisms in narrow-bandgap InAs/InAsSb type-II superlattices and InAsSb alloys," *Appl. Phys. Lett.* 103, 052106 (2013); and E. H. Steenbergen et al, "Significantly improved minority carrier lifetime observed in a longwavelength infrared III-V type-II superlattice comprised of InAs/InAsSb," *Appl. Phys. Lett.* 99, 251110 (2011).

Figure 2:
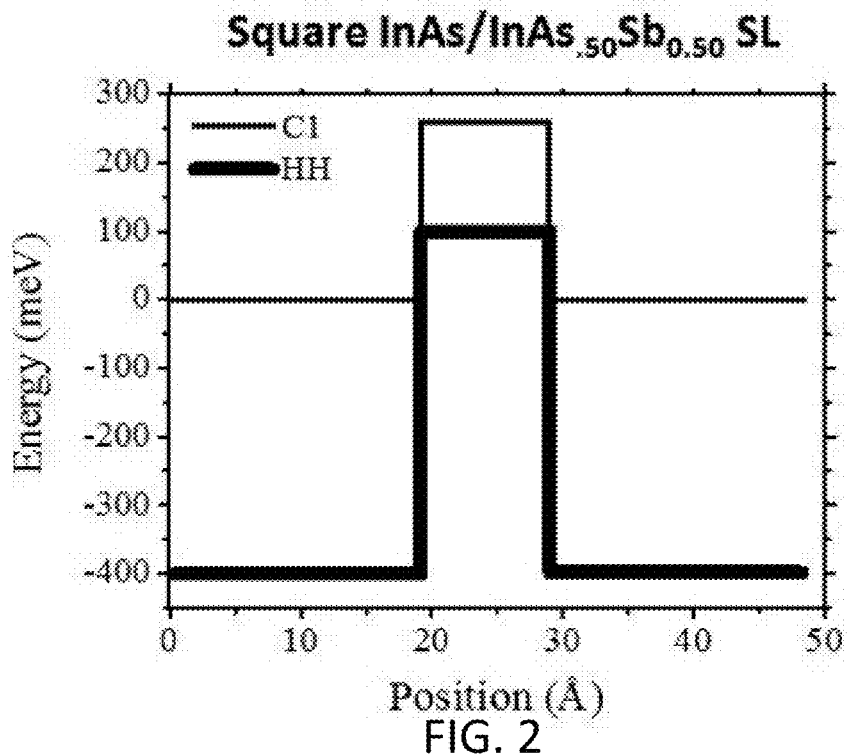
FIG. 2 is an energy-level diagram obtained by numerical modeling that shows valence and conduction band edges for an example superlattice structure without graded compositional profiles.

FIG. 2 is an energy-level diagram obtained by numerical modeling that shows valence band edge HH (this is the edge of a heavy hole band) and conduction band edge C1. These energy levels are plotted versus position for one 48 Å wide period of a square-wave-profile superlattice in which compositions are substantially independent of position in both the binary (InAs) and tertiary (InAsSb) layers. The tertiary composition is $InAs_{0.50}Sb_{0.50}$. As seen in the figure, the width of the tertiary layer, which is in the middle portion of the structure, is approximately 10 Å.

This structure provides a baseline example. The bandgap of this structure at a temperature of 100K was determined to be 5.3 μm (equivalent wavelength), the heavy hole mass in the parallel direction was determined to be 0.0310 (in units of the electronic mass $m_e$), and most significantly, the heavy hole effective mass in the perpendicular direction was determined to be 1.273.

Figure 3:
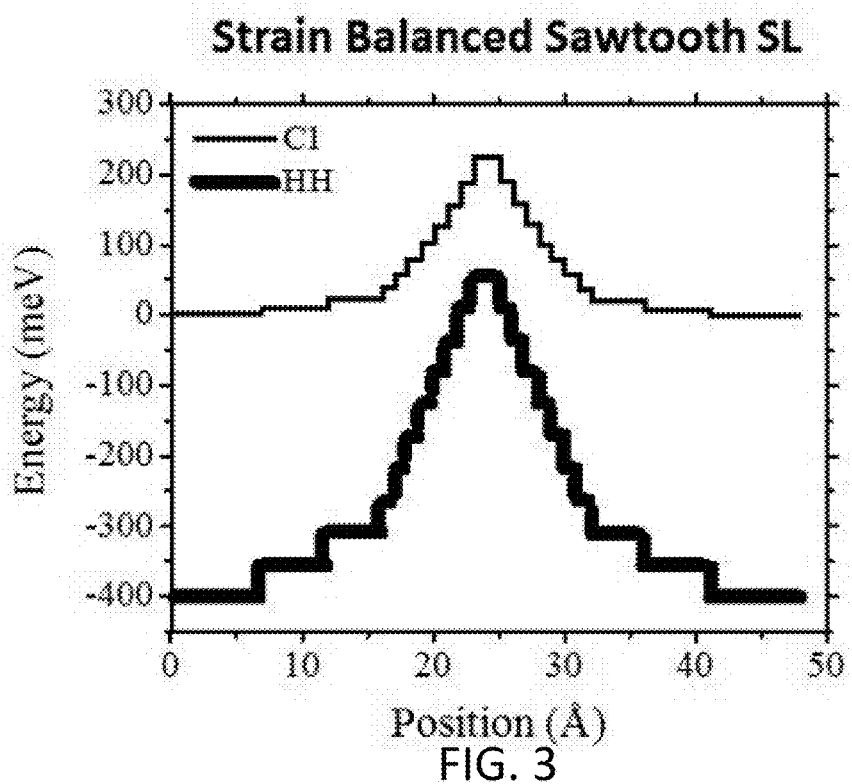
FIG. 3 is an energy-level diagram obtained by numerical modeling that shows valence and conduction band edges for an example superlattice structure that includes graded compositional profiles according to an embodiment of the present invention.

FIG. 3 is an energy-level diagram showing the same band edges for a 48 Å wide period of a sawtooth-profile superlattice. Here, the Sb concentration is varied in steps that approximate a trapezoid. The composition in each step is readily inferred from the size of the bandgap at that step and the energy levels that have been plotted.

The bandgap of this structure at a temperature of 100K was determined to have a value near but somewhat greater than 5.0 μm, the heavy hole mass in the parallel direction was determined to be 0.0292, and most significantly, the heavy hole effective mass in the perpendicular direction was determined to be 0.759, which is only 60% the corresponding baseline effective mass. The smaller effective mass is advantageous because it can lead to higher hole mobility, which in turn tends to increase detector quantum efficiency.

More generally, an embodiment of the present invention will be especially advantageous if it provides a heavy hole effective mass in the perpendicular direction that is 0.9 $m_e$ or less.

Our intent has been to control at least the composition of the tertiary, e.g. the InAsSb, layers so that each of those layers has a concentration gradient in, e.g., Sb. More specifically, the intent is to control the composition of the transition between the binary and tertiary layers to improve vertical transport. (Vertical transport is transport in the direction perpendicular to the planes of the SL layers. In the example provide here, the same concentration profile is repeated in each InAsSb layer. However, we do not exclude the possibility of varying the concentration profile over the superlattice. Likewise, although we have provided the example of a trapezoidal profile, other profile geometries are not excluded. What is believed essential is to have a gradient in Sb concentration on at least one side of each tertiary layer.

Although an example embodiment described here uses the InAs/InAsSb superlattice material system, this example should be understood as illustrative and not as limiting the scope of the invention. For example, we believe that the principles described here can be applied to other material systems such as InAs/AlGaAs, InAs/AlGaInAs, GaAs/AlGaAs, and InP/InGaAsP, as will be understood by those skilled in the art. (Here In is indium, As is arsenic, Al is aluminum, Ga is gallium, and P is phosphorus.) In examples of such systems, at least one of the repeated layers of the superlattice comprises one or more semiconductors selected from the list consisting of InAs, GaAs, and InP.

Some example devices that could beneficially use the inventive structure include p-n junction (diode) photodetectors and heterojunction photodetectors.

What is claimed is:

1. A photodetector comprising:
   a substrate;
   a III-V superlattice overlying the substrate and comprising two or more periods stacked in a vertical direction; and
   electrical contacts connected on opposing sides of the superlattice for electrical conduction of photogenerated carriers between the electrical contacts and through the superlattice in the vertical direction, wherein:
   each period comprises a first semiconductor layer and a second semiconductor layer that is different in composition from the first semiconductor layer;
   each first semiconductor layer and each second semiconductor layer has a top side distal the substrate and a bottom side proximal the substrate;
   at least one of said first and second semiconductor layers comprises one or more semiconductors selected from the list consisting of InAs, GaAs, and InP;
   at least one of said first and second semiconductor layers has a graded composition;
   the first semiconductor layer comprises InAs;
   the second semiconductor layer comprises InAsSb; and
   the second semiconductor layer has a graded composition wherein the Sb concentration is varied.

2. The photodetector of claim 1, wherein the Sb concentration in each second semiconductor layer increases from at least one of the top and bottom sides of the layer toward the middle of the layer.

3. The photodetector of claim 1, wherein the Sb concentration in each second semiconductor layer increases from the top side of the layer and from the bottom side of the layer toward the middle of the layer.

4. The photodetector of claim 1, wherein the Sb concentration in each second semiconductor layer has a trapezoidal profile that is greatest in the middle of the layer.

5. The photodetector of claim 1, wherein:
   each first semiconductor layer has a central portion that is substantially free of Sb; and
   within each period, there is a concentration gradient of Sb that crosses an interface between a first semiconductor layer and an adjacent second semiconductor layer.

6. The photodetector of claim 1, wherein each period has a thickness in the range 10 Å to 500 Å.

7. The photodetector of claim 1, wherein each period has a thickness of approximately 48 Å.

8. The photodetector of claim 1, wherein:
   the III-V superlattice has a heavy hole effective mass of 0.9 $m_e$ or less in the vertical direction.

* * * * *